(12) United States Patent
Koo et al.

(10) Patent No.: US 7,915,805 B2
(45) Date of Patent: Mar. 29, 2011

(54) ORGANIC ELECTROLUMINESCENT DISPLAY AND METHOD OF MANUFACTURE

(75) Inventors: Won-hoe Koo, Suwon-si (KR); Hoon Kim, Hwaseong-si (KR); Jin-koo Chung, Suwon-si (KR); Jung-mi Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 458 days.

(21) Appl. No.: 11/936,021

(22) Filed: Nov. 6, 2007

(65) Prior Publication Data

US 2008/0106192 A1  May 8, 2008

(30) Foreign Application Priority Data

Nov. 7, 2006 (KR) .................. 10-2006-0109530

(51) Int. Cl.
*H01J 1/62* (2006.01)
*H01J 63/04* (2006.01)

(52) U.S. Cl. .................. 313/504; 445/24; 313/110

(58) Field of Classification Search .................. 313/116, 313/110, 111, 504, 506, 512, 510, 117; 362/627; 359/619; 445/24, 25; 315/169.3; 428/690, 428/917; 427/66; 345/76, 45, 36; 257/40, 257/86, 79

See application file for complete search history.

(56) References Cited

U.S. PATENT DOCUMENTS

| 6,639,726 | B1 * | 10/2003 | Campbell | 359/619 |
| 2001/0009442 | A1 * | 7/2001 | Fukuyoshi et al. | 348/335 |
| 2003/0020399 | A1 * | 1/2003 | Moller et al. | 313/504 |
| 2003/0122480 | A1 * | 7/2003 | Wei et al. | 313/506 |
| 2004/0189185 | A1 * | 9/2004 | Yotsuya | 313/501 |
| 2007/0046863 | A1 * | 3/2007 | Miyao et al. | 349/95 |
| 2008/0055937 | A1 * | 3/2008 | Chuang et al. | 362/627 |

FOREIGN PATENT DOCUMENTS

| JP | 10300904 A | * 11/1998 |
| JP | 2004-361641 | 12/2004 |
| JP | 2006-023683 | 1/2006 |
| KR | 1020050081361 | 8/2005 |

OTHER PUBLICATIONS

JP 10-300904 A Kato et al. Machine Translation to English.*
English Translation of Korean Publication 10-2005-0081361.*

* cited by examiner

*Primary Examiner* — Nimeshkumar D Patel
*Assistant Examiner* — Glenn Zimmerman
(74) *Attorney, Agent, or Firm* — Innovation Counsel LLP

(57) ABSTRACT

An organic electroluminescent display having better photoluminescence efficiency includes a first electrode, an organic light-emitting layer, and a second electrode sequentially disposed on a first surface of an insulating substrate, and a plurality of convex patterns disposed on a second surface of the insulating substrate opposite to the first surface and spaced apart from each other, and which are formed of a transparent sealant having a viscosity of 5,000 to 150,000 cp and comprised of an epoxy- or acrylate-based resin, together with a plurality of concave patterns interposed between the convex patterns.

9 Claims, 7 Drawing Sheets

UV OR HEAT

ORGANIC ELECTROLUMINESCENT DISPLAY AND METHOD OF MANUFACTURE

CROSS-REFERENCE TO RELATED APPLICATION

This application claims priority from Korean Patent Application No. 10-2006-0109530 filed on Nov. 7, 2006 in the Korean Intellectual Property Office, the disclosure of which is incorporated herein by reference in its entirety.

BACKGROUND OF THE INVENTION

1. Field of the Invention

The present invention relates to an organic electroluminescent (EL) display and a method of manufacturing the same, and more particularly, to an organic EL display having better photoluminescence efficiency and a method of manufacturing the same.

2. Description of the Related Art

Organic electroluminescent (EL) displays are devices that emit light using energy generated by the recombination of electrons and holes which are injected into and transported in an organic light-emitting layer interposed between an anode, which is a hole injecting electrode, and a cathode, which is an electron injecting electrode. Organic EL displays are self-emitting devices, and include no auxiliary lamps, unlike liquid crystal displays. Thus, research to achieve higher brightness and energy efficiency of organic EL displays continues. The energy efficiency of organic EL displays can be classified into internal quantum efficiency and external quantum efficiency.

A satisfactory level of internal quantum efficiency can be achieved by selecting appropriate materials for the anode, a cathode, and the organic light-emitting layer. However, the level of external quantum efficiency is still unsatisfactory. That is, glass or the like used as an insulating substrate has a refractive index significantly different from that of ambient air so that light that is not emitted outside of the display device trapped inside the display device because of total internal reflection. In this regard, in order to decrease total internal reflectivity, attempts have been made to attach a microlens array to an outer surface of an insulating substrate. Unfortunately, attaching the microlens array not only makes the manufacturing process complicated but is not suitable to applications for a large-sized substrate, which makes the microlens technology impractical.

SUMMARY OF THE INVENTION

Embodiments of present invention provide an organic electroluminescent (EL) display having better photoluminescence efficiency together with a method of manufacturing the organic EL display.

According to an aspect of the present invention, an organic EL display includes an insulating substrate, a first electrode, an organic light-emitting layer, and a second electrode which are sequentially disposed on a first surface of the insulating substrate. A plurality of convex patterns are disposed on a second surface of the insulating substrate opposite to the first surface, spaced apart from each other are formed of a transparent sealant having a viscosity of 5,000 to 150,000 cp and comprising an epoxy- or acrylate-based resin. A plurality of concave patterns are interposed between the convex patterns.

According to another aspect of the present invention, a method of manufacturing an organic EL display comprises sequentially forming a first electrode, an organic light-emitting layer, and a second electrode on a first surface of an insulating substrate, and forming a plurality of convex patterns and concave patterns on a second surface of the insulating substrate opposite to the first surface, wherein the convex patterns are spaced apart from each other and formed of a transparent sealant having a viscosity of 5,000 to 150,000 cp and are comprised of an epoxy- or acrylate-based resin, the concave patterns being interposed between the convex patterns.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION

Figure 1:
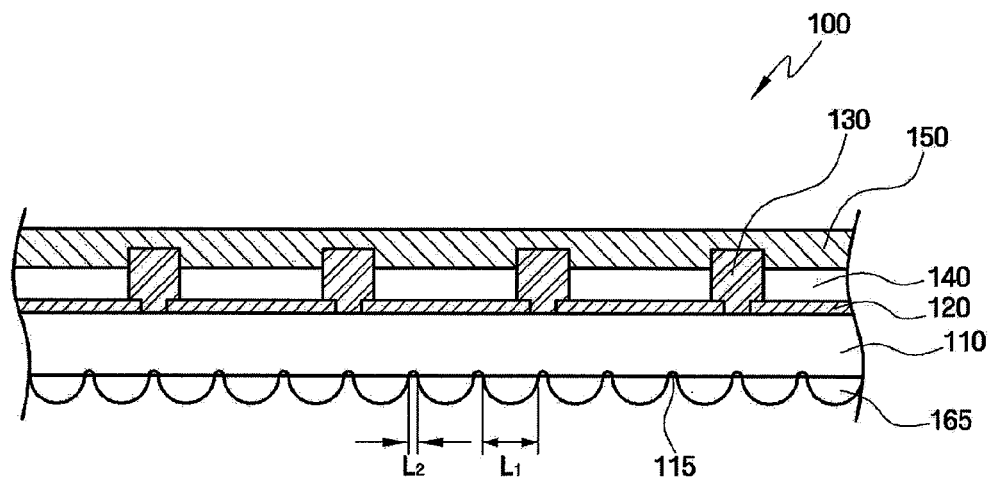
FIG. 1 is a sectional view illustrating an organic electroluminescent (EL) display according to a first embodiment of the present invention.

In the following description, it will be understood that when an element or a layer is referred to as being "on" another element or layer, it can be directly on the other element or layer, or intervening layers or elements may also be present. In contrast, when an element is referred to as being "directly on" another element, there are no intervening elements present. The terms "and/or" should be taken to mean any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

Hereinafter, an organic electroluminescent (EL) display according to a first embodiment of the present invention will be described with reference to FIG. 1. FIG. 1 is a sectional view illustrating the organic EL display according to the first embodiment of the present invention.

Referring to FIG. 1, a base substrate of an organic EL display 100 may be an insulating substrate 110 such as transparent glass or plastic. A first electrode 120, an organic light-emitting layer 140, and a second electrode 150 are sequentially disposed on a surface of the insulating substrate 110.

The first electrode 120 may be formed of metal or metal oxide with a high work function, so that it can be used as an anode of the organic EL display 100. For example, the first electrode 120 may be formed of ITO, IZO, or the like. In addition to the advantage of a high work function, ITO and IZO can be efficiently used in a rear emission type organic EL display that emits light toward the insulating substrate 110.

The first electrode 120 is electrically separated into individual units, which correspond to pixels. The individual units of the first electrode 120 are independently driven by at least one switching device (not shown), e.g., a thin film transistor.

The organic light-emitting layer 140 is disposed on the first electrode 120 to overlap with the first electrode 120. For example, as illustrated in FIG. 1, the organic light-emitting layer 140 may be formed to completely overlap the first electrode 120. The organic light-emitting layer 140 is partitioned by barrier ribs 130 on a pixel-by-pixel basis.

The second electrode 150 is disposed on the organic light-emitting layer 140. The second electrode 150 may be formed of a material with a low work function to be used as a cathode of the organic EL display 100. For example, the second electrode 150 may be formed of a highly reflective material such as MgAg or CaAl. A constant voltage may be applied to all pixels in the second electrode 150, unlike the first electrode 120.

A hole transport layer (not shown) may be further interposed between the first electrode 120 and the organic light-emitting layer 140. When needed, a hole injection layer (not shown) may be further interposed between the first electrode 120 and the hole transport layer. Similarly, an electron transport layer (not shown) may be further interposed between the second electrode 150 and the organic light-emitting layer 140. When needed, an electron injection layer (not shown) may be further interposed between the second electrode 150 and the electron transport layer.

Convex patterns 165 are formed on an opposite surface of the insulating substrate 110 to the organic light-emitting layer 140. Hereinafter, the surface of substrate 110 opposite to the organic light emitting layer 140 will simply be referred to as "the opposite surface of substrate 110". The convex patterns 165 are formed of a transparent sealant. For example, the transparent sealant may include an epoxy-based resin or an acrylate-based resin. Moreover, in addition to the resin, the sealant may further include a filler in order to decrease the penetration of moisture and oxygen, and at the same time, to adjust the viscosity of the sealant. For example, the filler may be micaceous or spherical talc. In addition, when needed, the sealant may further include a photo initiator which is associated with the curing of the sealant, and/or a coupling agent which confers an adhesion force to the sealant.

The sealant may have a viscosity of 5,000 to 150,000 cp. A sealant viscosity of 5,000 cp or more is advantageous to form convex patterns. Taking into consideration the process conditions and the shapes of the convex patterns 165, the viscosity of the sealant may be 150,000 cp or less.

The sealant can be chosen from products used for adhesion, etc. in the display field, and thus, is easily available and advantageous in terms of cost competitiveness. Moreover, as will be described later, a screen printing process can be applied to the formation of the convex patterns 165 using the sealant, thereby ensuring process simplicity.

The convex patterns 165 may be in the shape of a longitudinally cut cylinder or a longitudinally cut cylindroid so as to achieve substantially uniform brightness regardless of the incidence direction of light. Thus, the convex patterns 165 may have a semicircular or semi-ellipsoidal section profile. Preferably, the convex patterns 165 may have the shape of the smaller of two three-dimensional shapes produced by longitudinally cutting a cylinder or cylindroid. The convex patterns 165 become thinner the farther they are from the opposite surface of the insulating substrate 110.

The diameter $L_1$ of the convex patterns 165 on the opposite surface of the insulating substrate 110 may be 900 μm or less in order to achieve good photoluminescence efficiency as will be described later. However, the diameter $L_1$ of the convex patterns 165 is required to be greater than a predetermined value to guarantee that the shape of a pattern can be reliably formed. In this regard, the diameter $L_1$ of the convex patterns 165 may be 10 μm or more.

The convex patterns 165 are separated from each other by a predetermined distance due to the characteristics of the sealant material of which the convex patterns 165 are made. Concave patterns 115 are formed between the convex patterns 165 so as not to expose the opposite surface of the insulating substrate 110 to the outside.

If only the convex patterns 165 are present, the opposite surface of the insulating substrate 110 might be exposed to the outside between the convex patterns 165 thereby allowing light incident at the exposed surface of the insulating substrate 110 to be totally reflected thereby preventing emission of light from the organic EL display 100. Accordingly, the concave patterns 115 are formed between the convex patterns 165 to decrease the angle of light incident between the convex patterns 165 and eliminate total reflection.

In the present embodiment, the concave patterns 115 are formed by etching the surface of an insulating substrate 110 made of glass, or the like, which is opposite to the organic light-emitting layer 140. The surface of the insulating substrate 110 between the convex patterns 165 can be wet- or dry-etched. For example, the concave patterns 115 may be formed by etching the insulating substrate 110 using an etching gas, e.g., $CF_4$, Ar, or $O_2$. The concave patterns 115 may be in the shape of a longitudinally cut cylinder or a longitudinally cut cylindroid, like the convex patterns 165. Thus, the convex patterns 165 and the concave patterns 115 are continuously connected to form a single closed curve at the opposite surface of the insulating substrate 110 to the organic light-emitting layer 140.

The diameter ratio ($L_1/L_2$) of the convex patterns 165 to the concave patterns 115 may be 1:10 to 10:1, taking into consideration the distance between two adjacent ones of the convex patterns 165 made of a sealant, and the time required to etch the insulating substrate 110.

When a voltage is applied to the first electrode 120 and the second electrode 150 of the organic EL display 100 having the above-described structure, holes from the first electrode 120 and electrons from the second electrode 150 are transported into the organic light-emitting layer 140. The transported holes and the electrons recombine in the organic light-emitting layer 140, thereby emitting light corresponding to the predetermined energy difference. Light generated in the organic light-emitting layer 140 is emitted in all directions. Light incident on the first electrode 120 is transmitted through the first electrode 120 and emitted from the organic EL display 100. Light incident on the second electrode 150 is reflected from the highly reflective second electrode 150 and transmitted through the first electrode 120. Light transmitted through the first electrode 120 is emitted from the organic EL display 100 via the insulating substrate 110 and the convex patterns 165, to be visualized as images.

The convex patterns 165 reduce the total reflectivity of incident light, thereby increasing the photoluminescence efficiency of light generated by the organic light-emitting layer 140.

Figure 2:
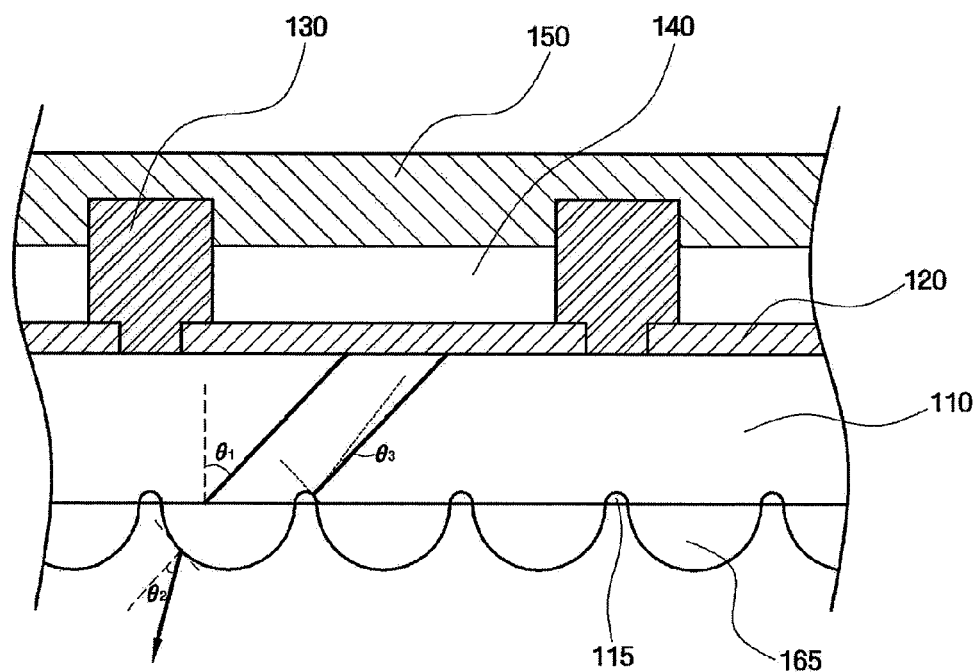
FIG. 2 is a sectional view illustrating the photoluminescence efficiency of the organic EL display according to the first embodiment of the present invention.

Hereinafter, the principle of increasing photoluminescence efficiency using convex patterns will be described in more detail with reference to FIG. 2. FIG. 2 is a sectional view for illustrating the photoluminescence efficiency of the organic EL display according to the first embodiment of the present invention.

Referring to FIG. 2, light from an organic light-emitting layer 140 is incident on a first electrode 120, passes through an insulating substrate 110, and then reaches convex patterns 165 or concave patterns 115 formed at the opposite surface of the insulating substrate 110. With respect to the pathway of light incident at an angle of $\theta_1$ with respect to the normal line of the opposite surface of the insulating substrate 110. Where the opposite surface of the insulating layer 110 directly contacts an air layer, light is refracted at the interface between the insulating substrate 110 and the air layer due to the refractive index difference between the insulating substrate 110 and the air layer. Light advances from the insulating substrate 110, which is a more densely concentrated medium, to the air layer, which is a sparsely concentrated medium. Thus, total internal reflection may occur at an incidence angle $\theta_1$ greater than the critical angle, thereby resulting in no emission of light to the outside.

On the other hand, where the opposite surface of the insulating layer 110 contacts the convex patterns 165, light is refracted at the interface between the insulating substrate 110 and the convex patterns 165 due to the refractive index difference between the insulating substrate 110 and the convex patterns 165. Here, the refractive index of the convex patterns 165 may be substantially the same as, greater than, or smaller than that of the insulating substrate 110, depending on a sealant constituting the convex patterns 165. Even when the refractive index of the convex patterns 165 is smaller than that of the insulating substrate 110, it is greater than that of an air layer. Thus, the refractive index difference between the insulating substrate 110 and the convex patterns 165 is much smaller than that between the insulating substrate 110 and the air layer.

For example, when the refractive index of the convex patterns 165 is greater than or substantially the same as that of the insulating substrate 110, light advances from a sparsely concentrated medium to a more densely concentrated medium or from one to the other of two media having substantially the same refractive index, and thus, total internal reflection does not occur. Even when the refractive index of the convex patterns 165 is smaller than that of the insulating substrate 110, the refractive index difference between the convex patterns 165 and the insulating substrate 110 is much smaller than that between the insulating substrate 110 and an air layer as described above. Thus, the critical angle of total internal reflection is increased, thereby significantly reducing the quantity of totally reflected light.

Light transmitted through the convex patterns 165 is again refracted at the interface between the convex patterns 165 and an external air layer. Here, the interface between the convex patterns 165 and the air layer is convex, i.e., curves outward, and thus, the incidence angle $\theta_2$ is much smaller than the incidence angle $\theta_1$. Thus, light is not totally reflected but is refracted and emitted to the outside.

Where the opposite surface of the insulating layer 110 contacts the concave patterns 115, the refractive index difference between the concave patterns 115 and the opposite surface of the insulating layer 110 is almost the same as that of the opposite surface of the insulating substrate 110 since the concave patterns 115 are formed by etching the insulating substrate 110. However, the angle $\theta_3$ of light incident on the concave patterns 115 is much smaller than the angle $\theta_1$ of light incident on the opposite surface of the insulating substrate 110. Thus, even when the concave patterns 115 directly contact the air layer and have a refractive index that is significantly different from the refractive index of the air layer, the incident light is not totally reflected but is emitted to the outside.

Hereinafter, a method of manufacturing the organic EL display according to the first embodiment of the present invention will be described with reference to FIGS. 3 through 6 and FIG. 1. FIGS. 3 through 6 are schematic views illustrating a method of manufacturing the organic EL display according to the first embodiment of the present invention.

Figure 3:
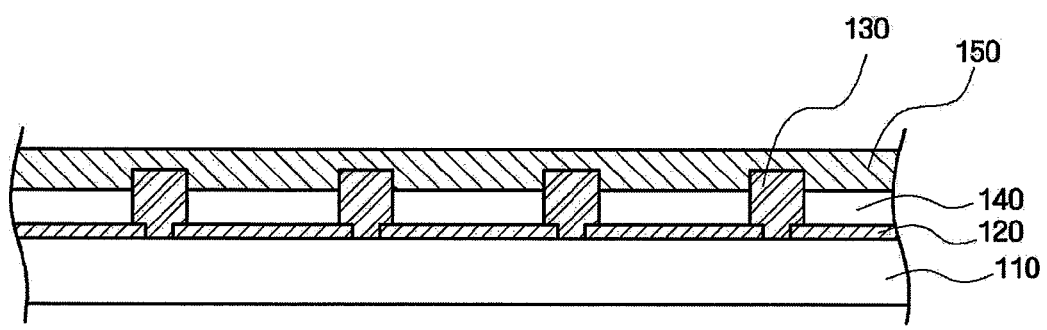
FIGS. 3 through 6 are schematic views illustrating a method of manufacturing the organic EL display according to the first embodiment of the present invention.

Referring to FIG. 3, a transparent insulating substrate 110 is provided. Then, a first electrode 120, an organic light-emitting layer 140, and a second electrode 150 are sequentially deposited on the surface of the insulting substrate 110. The deposited structure can be manufactured as follows. That is, the first electrode 120 made of ITO or IZO is formed on the insulating substrate 110 made of transparent glass or plastic, and a barrier rib 130 is then formed. Then, the organic light-emitting layer 140 is formed in a space defined by the barrier rib 130. Then, the second electrode 150 made of MgAg or CaAl is formed on the organic light-emitting layer 140. Each process is well known to those of ordinary skill in the art, and thus, a detailed description thereof will be omitted.

Figure 4:
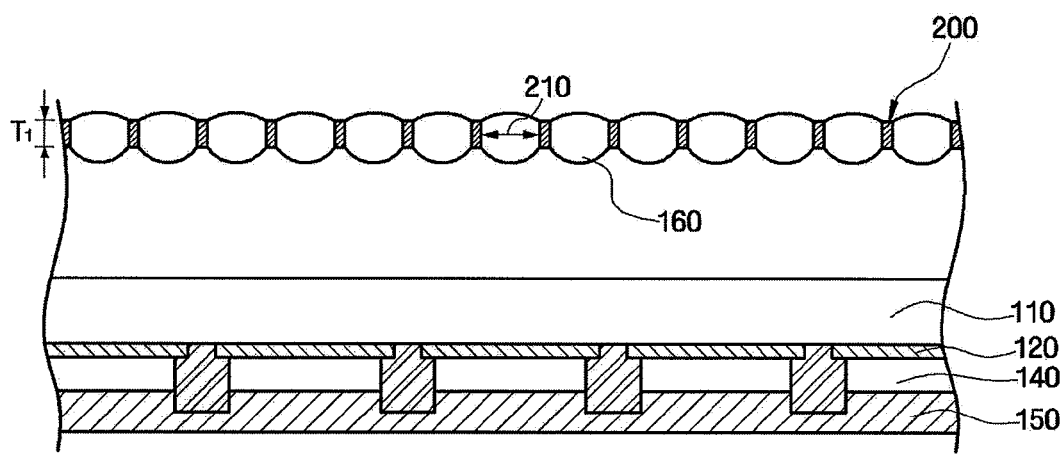

Next, referring to FIG. 4, together with FIG. 3, the insulating substrate 110 is turned upside down so that the opposite surface of the insulating substrate 110 faces upward. Then, a screen printing mask 200 is disposed above and close to the insulating substrate 110. The length $T_1$ of the screen printing mask 200 may be 0.1 to 9.9 µm considering the viscosity of a sealant 160 and the shape of convex patterns sought to be formed. A plurality of openings 210 are formed in the screen printing mask 200. The openings 210 respectively correspond to desired convex patterns. The openings 210 are filled with transparent sealant 160. The sealant 160 may include an epoxy-based resin or an acrylate-based resin. In addition to the resin, the sealant 160 may further include a filler to decrease the penetration of moisture and oxygen and to adjust the viscosity of the sealant 160. Of course, the sealant 160 may further include other additives. Due to these additives, the sealant 160 may have UV or thermal curing properties.

Figure 5:
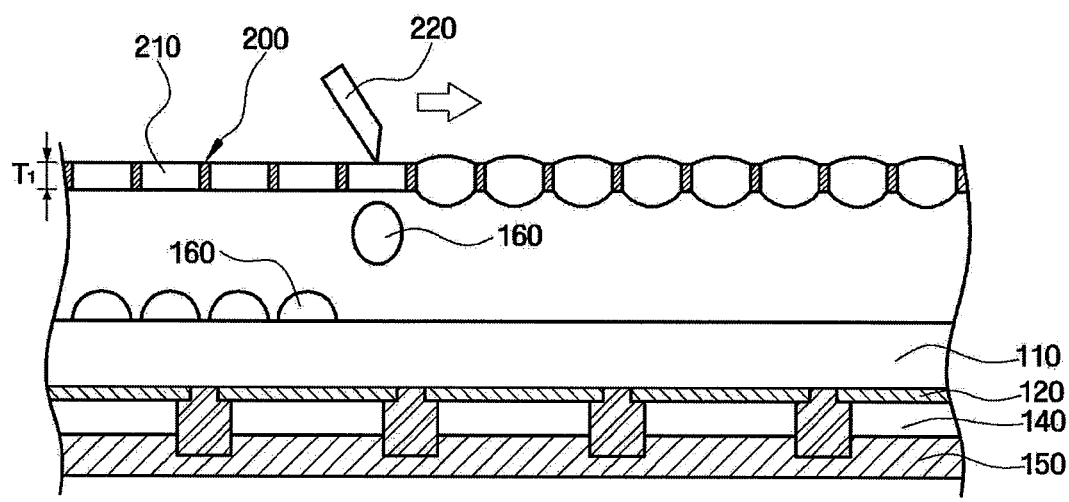

Referring to FIG. 5, the sealant 160 filled into the openings 210 is pressed by moving a blade 220 on an upper surface of the screen printing mask 200. The sealant 160 pressed by the blade 220 drops onto the opposite surface of the insulating substrate 111. When the viscosity of the sealant 160 is 150,000 cp or less, the dropping of the sealant 160 can be easily performed. When dropping the sealant 160, liquid-phase sealant droplets 160 have a surface tension depending on the length $T_1$ of the screen printing mask 200 and the viscosity of the sealant 160, and thus, have a convex shape.

The length $T_1$ of the screen printing mask 200 can be 0.1 to 9.9 µm so that the section profile of the sealant droplets 160 dropped onto the insulating substrate 110 is close to a semi-circular or semi-ellipsoidal shape. Thus, the sealant droplets 160 dropped onto the insulating substrate 110 may be convex-shaped and spaced apart from each other. Here, in order for the sealant droplets 160 to have a reliable convex shape on the opposite surface of the insulating substrate 110, e.g., a three-dimensional structure produced by longitudinally cutting a cylinder or a cylindroid, the sealant 160 may have a viscosity of 5,000 cp or more. The above-described screen printing process is simple and can be easily applied to a large-sized insulating substrate.

Figure 6:
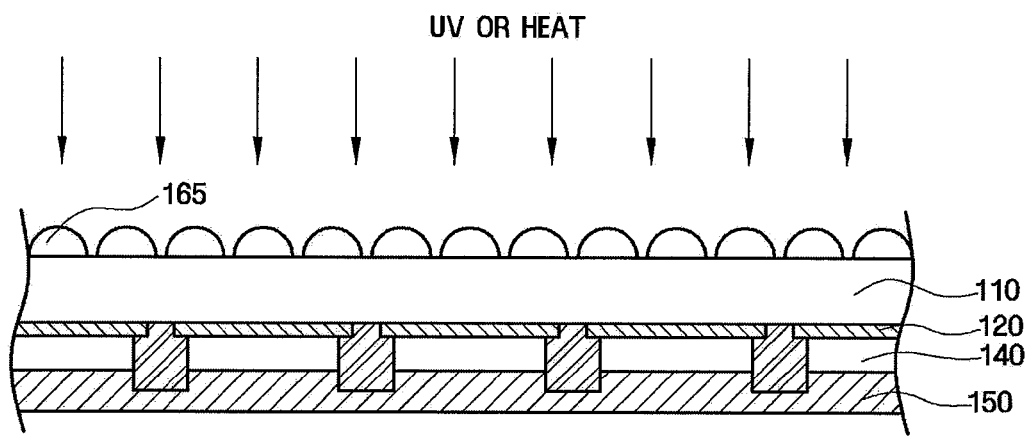

Next, referring to FIG. 6, together with FIG. 5, the sealant droplets 160 dropped onto the insulating substrate 110 are cured with UV light or heat to complete convex patterns 165.

Next, referring to FIG. 1, the insulating substrate 110 with the convex patterns 165 is placed in, e.g., a reactive ion etching (RIE) apparatus, and an exposed surface of the insulating substrate 110 between the convex patterns 165 is etched using an etching gas, e.g., $CF_4$, Ar, or $O_2$, to complete concave patterns 115. As a result, the convex patterns 165 and the concave patterns 115 are continuously connected to form a single closed curve at the opposite surface of the insulating substrate 110.

Figure 7:
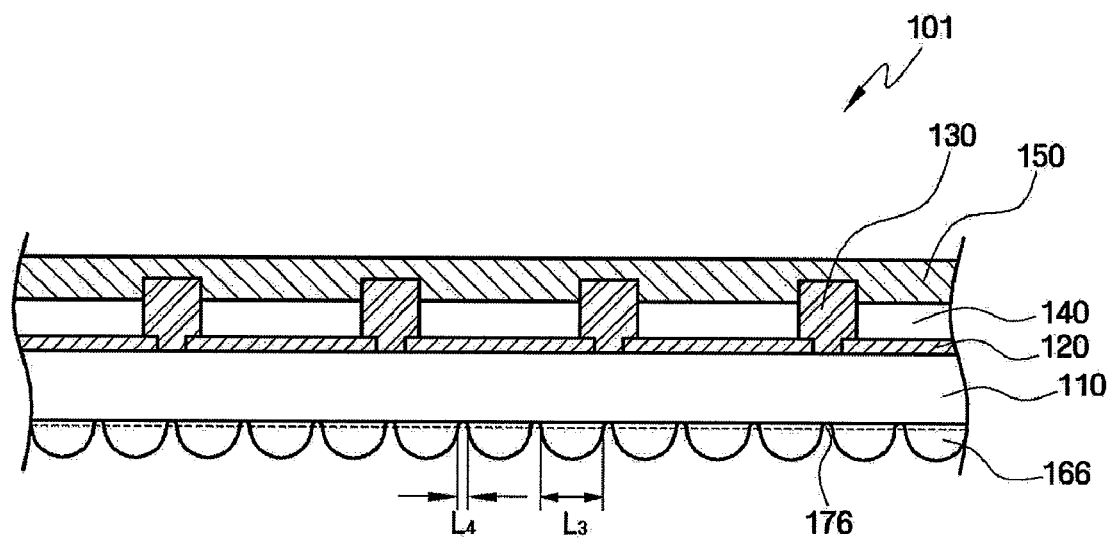
FIG. 7 is a sectional view illustrating an organic EL display according to a second embodiment of the present invention.

Hereinafter, an organic EL display according to a second embodiment of the present invention will be described with reference to FIG. 7. FIG. 7 is a sectional view illustrating an organic EL display according to a second embodiment of the present invention. For convenience of illustration, the same components as those of the previous embodiment are represented by the same reference numerals, and thus, the description thereof will be omitted or simplified. As illustrated in FIG. 7, an organic EL display 101 according to the second embodiment of the present invention has substantially the same structure as the organic EL display (100 of FIG. 1) of the previous embodiment except as described below. That is, the organic EL display 101 of the second embodiment of the present invention includes concave patterns 176 and convex patterns 166 which are formed of the same material.

Referring to FIG. 7, a first electrode 120, an organic light-emitting layer 140, and a second electrode 150 are sequentially deposited on a surface of an insulating substrate 110, as in the previous embodiment.

On the other hand, the convex patterns 166 are formed on the opposite surface of the insulating substrate 110, like in the previous embodiment. However, the convex patterns 166 of the present embodiment may be made of a transparent sealant with a viscosity of 25,000 to 150,000 cp, unlike in the previous embodiment. That is, the convex patterns 166 of the present embodiment may be formed of an epoxy resin or an acrylate resin, as in the previous embodiment, but the resin used in the present embodiment has a greater viscosity than that used in the previous embodiment. Thus, the convex patterns 166 with a semicircular or semi-ellipsoidal section profile are not separated from each other but are connected to each other via concave patterns 176 with a semicircular or semi-ellipsoidal section profile.

The concave patterns 176 are formed simultaneously with the convex patterns 166 using the same material, and thus, the ends of the convex patterns 166 are connected to each other via the concave patterns 176. The top surface of the semicircular or semi-ellipsoidal section of the concave patterns 176 may contact the opposite surface of the insulating substrate 110. The size of the concave patterns 176 may vary according to the viscosity of the sealant used in formation of the concave patterns 176. The diameter $L_3$ of the convex patterns 166 and the diameter $L_4$ of the concave patterns 176 may vary according to the viscosity of a sealant, and the diameter ratio ($L_3/L_4$) of the convex patterns 166 to the concave patterns 176 may be the same as that of the previous embodiment.

To sum up, the convex patterns 166 and the concave patterns 176 made of a sealant are continuously formed at the surface of the insulating substrate 110 contacting an air layer. Thus, light advancing toward the air layer from the insulating substrate 110 is not totally reflected but can be efficiently emitted toward the air layer.

Figure 8:
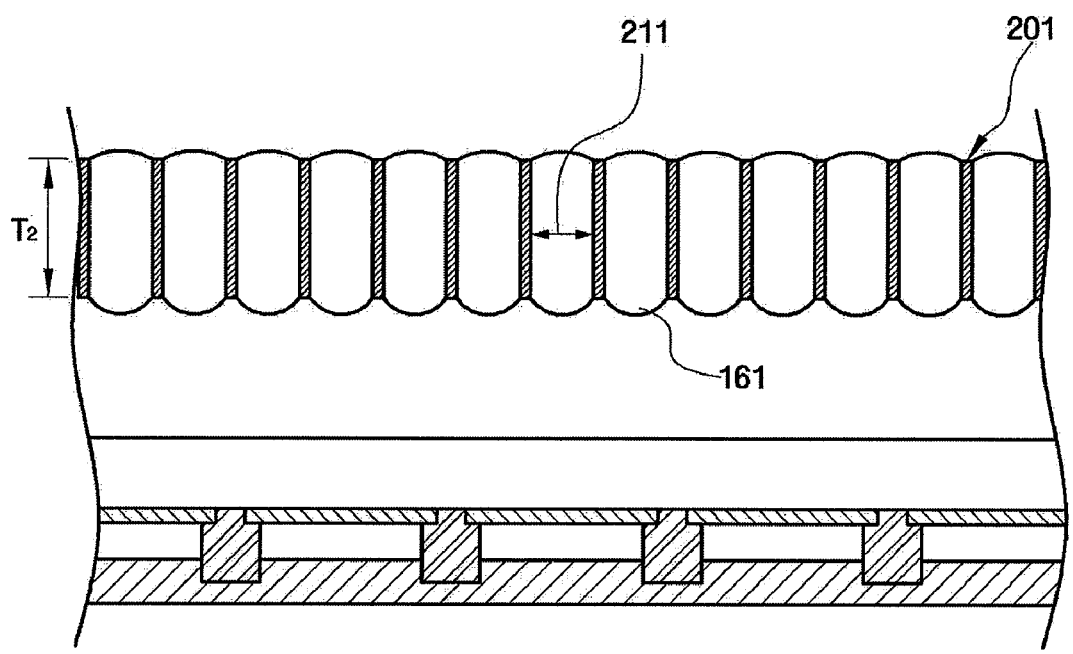
FIGS. 8 through 10 are schematic views illustrating a method of manufacturing the organic EL display according to the second embodiment of the present invention.
Figure 9:
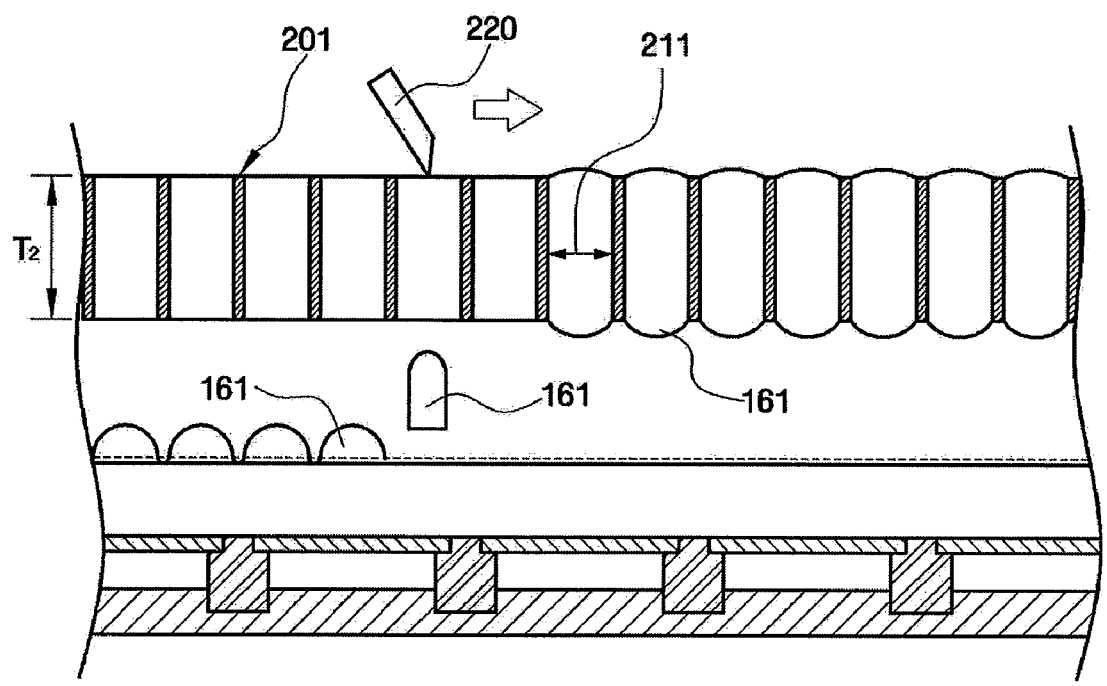
Figure 10:
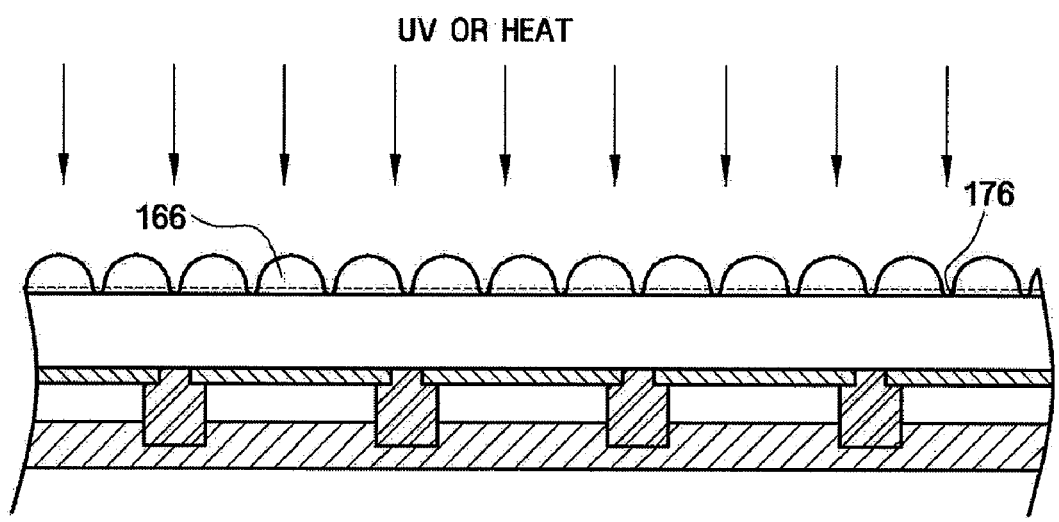

Hereinafter, a method of manufacturing the organic EL display according to the second embodiment of the present invention will be described with reference to FIGS. 8 through 10 and FIGS. 3 and 7. Description of structure and process that is the same as in the first embodiment of the present invention will be omitted or simplified. The method of manufacturing the organic EL display according to the second embodiment of the present invention will be described in terms of differences between it and the method of manufacturing the organic EL display according to the first embodiment of the present invention. FIGS. 8 through 10 are schematic views illustrating the method of manufacturing the organic EL display according to the second embodiment of the present invention.

First, as described above with reference to FIG. 3, an insulating substrate 110 having on a surface thereof a first electrode 120, an organic light-emitting layer 140, and a second electrode 150 is provided.

Next, referring to FIG. 8 and FIG. 3, the insulating substrate 110 is turned upside down so that the opposite surface of the insulating substrate 110 faces upward, and a screen printing mask 201 is then disposed above and close to the insulating substrate 110. The length $T_2$ of the screen printing mask 201 may be 10 to 100 μm considering the viscosity of a sealant 161 and the shape of convex patterns sought to be formed. In the present embodiment, the sealant 161 may be an epoxy or acrylate resin with a viscosity of 25,000 to 150,000 cp. By increasing the length $T_2$ of the screen printing mask 201, convex patterns (see 166 of FIG. 7) and concave patterns (see 176 of FIG. 7) can be formed at the same time.

Next, referring to FIG. 9, the sealant 161 filled in openings 211, is pressed by moving a blade 220 on an upper surface of the screen printing mask 201. The sealant 161 pressed by the blade 220 is dropped onto the opposite surface of the insulating substrate 110. In the present embodiment, the length $T_2$ of the screen printing mask 201 is as long as 10 to 100 μm and the viscosity of the sealant 161 is as high as 25,000 to 150,000 cp, and thus, the sealant 160 is dropped as sealant droplets 161 having an elongated ellipsoidal section profile. The sealant droplets 161 have a high viscosity, and thus, convex forms are connected to each other via concave forms at the opposite surface of the insulating substrate 110.

Next, referring to FIG. 10, the sealant droplets 161 dropped onto the insulating substrate 110 are cured with UV light or heat to complete convex patterns 166 and concave patterns 176. The resultant organic EL display 201 thus completed is illustrated in FIG. 7. The functions of the convex patterns 166 and the concave patterns 176 which are continuously connected are as described above.

As apparent from the above description, organic EL displays according to embodiments of the present invention include convex patterns and concave patterns, and thus, have high photoluminescence efficiency. Moreover, convex patterns or both convex and concave patterns are formed of an easily available sealant, and thus, organic EL displays according to embodiments of the present invention are advantageous in terms of cost competitiveness. In addition, organic EL displays according to embodiments of the present invention can be easily manufactured using a screen printing process alone or in combination with an etching process, thereby ensuring better manufacturing efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:
1. An organic electroluminescent display comprising:
an insulating substrate;

a first electrode, an organic light-emitting layer, and a second electrode which are sequentially disposed on a first surface of the insulating substrate; and a plurality of convex patterns disposed on a substantially planar second surface of the insulating substrate opposite to the first surface and spaced apart from each other, the patterns being formed of a transparent sealant having a viscosity of 25,000 to 150,000 cp and comprised of an epoxy- or acrylate-based resin, and a plurality of concave patterns interposed between the convex patterns and disposed on the substantially planar second surface of the insulating substrate, the concave patterns being formed of the same material as the convex patterns, wherein the convex patterns and the concave patterns are semicircular or semi-ellipsoidal in section profile, and the top surfaces of the concave patterns contact the second surface of the insulating substrate.

2. The organic electroluminescent display of claim 1, wherein the convex patterns have a diameter of 10 to 900 μm.

3. The organic electroluminescent display of claim 2, wherein the diameter ratio of the convex patterns to the concave patterns is 1:10 to 10:1.

4. A method of manufacturing an organic electroluminescent display, the method comprising:

sequentially forming a first electrode, an organic light-emitting layer, and a second electrode on a first surface of an insulating substrate; and forming a plurality of convex patterns and concave patterns at a second surface of the insulating substrate opposite to the first surface, wherein the convex patterns and concave patterns are formed at the same time by only one screen-printing process using a transparent sealant having a viscosity of 25,000 to 150,000 cp comprised of an epoxy- or acrylate-based resin, the concave patterns being interposed between the convex patterns.

5. The method of claim 4, wherein the convex patterns have a diameter of 10 to 900 μm.

6. The method of claim 5, wherein the diameter ratio of the convex patterns to the concave patterns is 1:10 to 10:1.

7. The method of claim 4, wherein the resin is a heat-curable or UV-curable resin, and wherein the formation of the convex patterns and the concave patterns comprises:

printing the sealant on the second surface of the insulating substrate using a screen printing mask; and curing the sealant.

8. The method of claim 7, wherein the screen printing mask has a length of 10 to 100 μm.

9. The method of claim 4, wherein the convex patterns and the concave patterns are semicircular or semi-ellipsoidal in section profile, and the top surfaces of the concave patterns contact the second surface of the insulating substrate.

* * * * *